United States Patent [19]

Colvin et al.

[11] Patent Number: 5,451,911
[45] Date of Patent: Sep. 19, 1995

[54] TIMING GENERATOR

[75] Inventors: Bryan J. Colvin; Masao Shindo, both of San Jose, Calif.

[73] Assignee: Media Vision, Inc., Fremont, Calif.

[21] Appl. No.: 224,349

[22] Filed: Apr. 7, 1994

[51] Int. Cl.[6] .................. H03B 5/00; H03K 3/64; H03L 7/06
[52] U.S. Cl. .................... 331/57; 331/1 A; 331/25; 327/291; 327/295; 327/141; 327/113; 327/158; 327/159
[58] Field of Search .............. 307/269; 331/57, 25, 331/1 A; 327/291, 295, 141, 113, 116, 152, 144, 145, 119, 120, 121, 122, 158, 159

[56] References Cited

U.S. PATENT DOCUMENTS

| | | | |
|---|---|---|---|
| 4,564,953 | 1/1986 | Werking | 377/52 |
| 5,008,636 | 4/1991 | Markinson et al. | 331/2 |
| 5,073,730 | 12/1991 | Hoffman | 327/142 X |
| 5,180,994 | 1/1993 | Martin et al. | 331/38 |
| 5,218,314 | 6/1993 | Efendovich et al. | 328/155 |
| 5,331,294 | 7/1994 | Watanabe et al. | 331/57 |
| 5,345,449 | 9/1994 | Buckingham et al. | 370/1.1 |

*Primary Examiner*—Robert J. Pascal
*Assistant Examiner*—Arnold Kinkead
*Attorney, Agent, or Firm*—Claude A. S. Hamrick; Emil C. Chang

[57] ABSTRACT

A timing generator contains an oscillator section (10) formed with a plural number of stages ($S_1$-$S_N$) for respectively producing a like number of stage signals ($V_{S1}$-$V_{SN}$) that sequentially change signal values at a basic oscillator frequency ($f_O$). The oscillator section is typically implemented as a ring oscillator. In response to the stage signals, a timing-signal generating section (14) generates one or more timing signals ($V_{T1}$-$V_{TM}$), each having at least two transitions corresponding to transitions of two or more of the stage signals. A control section (12), preferably arranged in a phase-locked loop, causes the oscillator frequency and a reference frequency ($f_R$) to have a substantially fixed relationship.

26 Claims, 9 Drawing Sheets

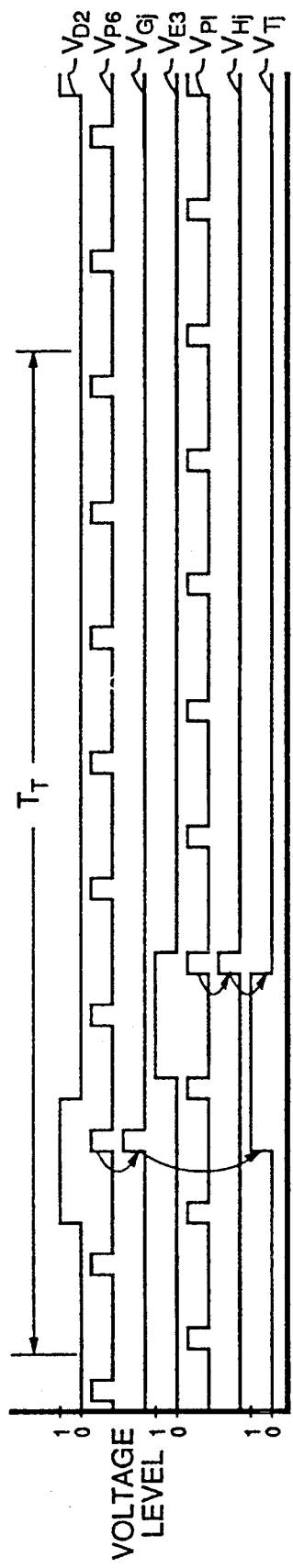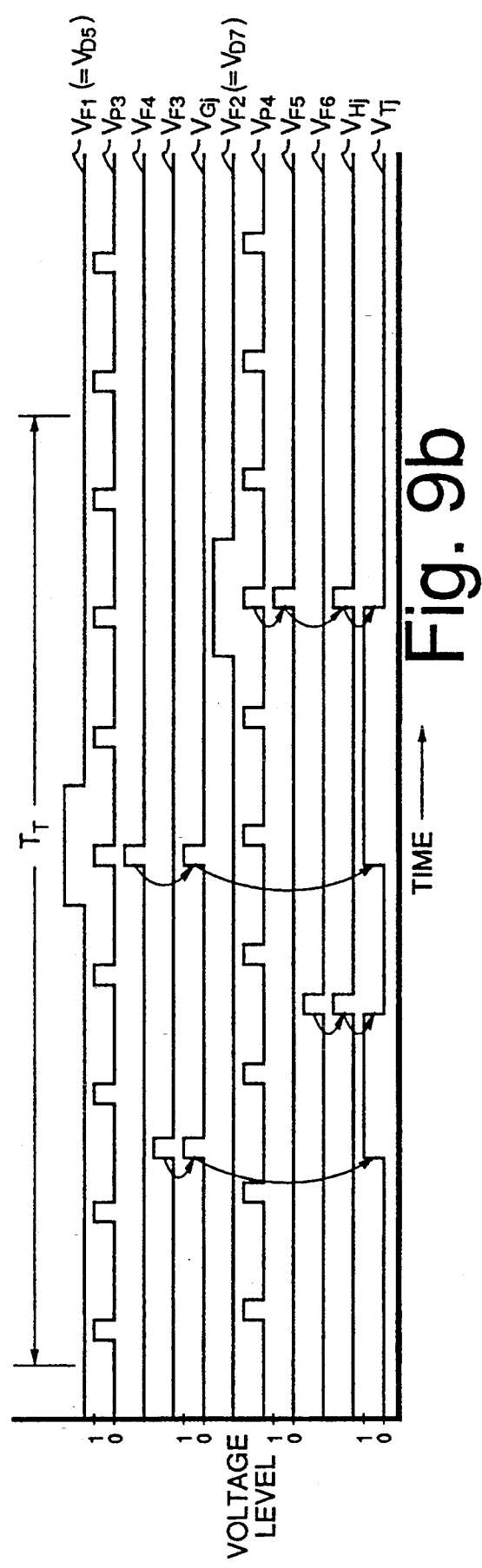

TIMING GENERATOR

FIELD OF USE

This invention relates to the generation of timing signals for electronic systems.

BACKGROUND ART

Timing signals which make periodic transitions between low and high voltage levels are used in digital electronic systems to control system operation. The signal transitions (or edges) define successive instants at which activities or operations can occur in a digital system.

The timing signals in a digital system are typically produced with the assistance of an oscillator, such as a crystal oscillator, that supplies clock pulses. The power consumption of a system that uses an oscillator to produce clock pulses increases with the oscillation frequency. Although crystal oscillators can reach frequencies of several hundred megahertz, a clock oscillator operating at such a frequency normally cannot be utilized with most state-of-the-art integrated circuits because the circuit power consumption would be too great. Excessive heat would be generated. In addition, a high-frequency oscillator introduces significant electromagnetic interference which is difficult to deal with and reduces system reliability.

Delay lines that delay signal transitions to create desired time intervals are also used to produce timing signals. Unfortunately, precision delay lines typically include inductors which cannot readily be incorporated into integrated circuits. It would be quite desirable to have a low-power technique for generating finely controllable timing signals having sharp transitions.

Hoffman, U.S. Pat. No. 5,073,730, disclose a circuit for controlling peak transition current in data buses of VLSI chips. Hoffman's circuit includes a ring oscillator formed with multiple high speed inverters arranged in a loop to produce a set of control signals with short time delay between them. The control signals are directly used to sequence the switching of the bus drivers so that the transients are spread over a time interval which is relatively short compared to the bus transfer cycle but allows time for some driver transients to end before others begin. In his circuit, Hoffman utilizes the control signals in producing further signals. However, each of the further signals is generated from only one of the control signals and therefore does not have rising and-/or falling edges that correspond to transitions of two or more of the control signals.

GENERAL DISCLOSURE OF THE INVENTION

The present invention furnishes a timing generator capable of producing finely controlled timing signals having sharp edges. The characteristics of the timing signals are typically indicative of an oscillator that runs faster than any oscillator which is used in the timing generator or whose oscillation signal is supplied as a clock input to the timing generator. For example, if a reference clock at 25–30 MHz is supplied to the timing generator of the invention, the generator can generate timing signals indicative of a 200-MHz oscillator even though none of generator's components actually run at more than 25–30 MHz. The timing generator also produces its timing signals at considerably reduced power dissipation compared to what would arise from using an oscillator whose oscillation frequency equals the frequency seemingly indicated by the characteristics of the timing signals.

Specifically, the present timing generator contains an oscillator section and a timing-signal generating section. The oscillator section is formed with a plural number of oscillator stages for respectively producing a like number of corresponding stage signals that sequentially move between signal levels at a basic oscillator frequency. The oscillator section is typically implemented as a ring oscillator. Each oscillator stage is then an inverting stage. In response to the stage signals, the generating section generates at least one timing signal having at least two transitions corresponding to transitions of two or more of the stage signals. For example, in a simple case, such a timing signal could consist of a periodic series of high-level pulses where the rising and falling edges of each pulse respectively correspond to rising edges of two different stage signals.

The timing generator typically includes a control section, preferably arranged in a phase-locked loop, for causing the oscillator frequency to have a substantially fixed relationship to a reference frequency. The reference frequency is defined by a reference signal supplied to the timing generator.

Consider the case in which the oscillator frequency substantially equals the reference frequency. Let N be the number of stages in the oscillator section. Although each stage runs at the oscillator frequency and thus substantially at the reference frequency, the time between a transition of the stage signal of one stage and the resulting transition of the stage signal of the next stage is approximately one Nth the time between consecutive transitions of the reference signal. As a group, the stage signals appear to make transitions at a frequency equal to N times the reference frequency.

At least two (and typically the great majority) of the transitions of each timing signal produced by the present timing generator correspond, as mentioned above, to transitions of at least two of the stage signals. Consequently, the locations of the transitions in each timing signal correspond to a frequency equal to N times the reference frequency even though the reference frequency is the highest frequency in the timing generator. The invention thereby achieves the benefit of an oscillator that runs at very high frequency, such as 200 MHz, without incurring the increased power usage and other problems that would arise if such an oscillator were actually used in or with the present timing generator.

BRIEF DESCRIPTION OF THE DRAWINGS

FIGS. 9a and 9b are graphs for the time variation of certain signals in the circuit portions of FIGS. 8a and 8b.

The low and high levels of the voltages illustrated in FIGS. 6, 7, 9a, and 9b are, for simplicity, respectively illustrated as "0" and "1". Like reference symbols are employed in the drawings and in the description of the preferred embodiments to represent the same or very similar item or items.

DESCRIPTION OF THE PREFERRED EMBODIMENTS

Figure 1:
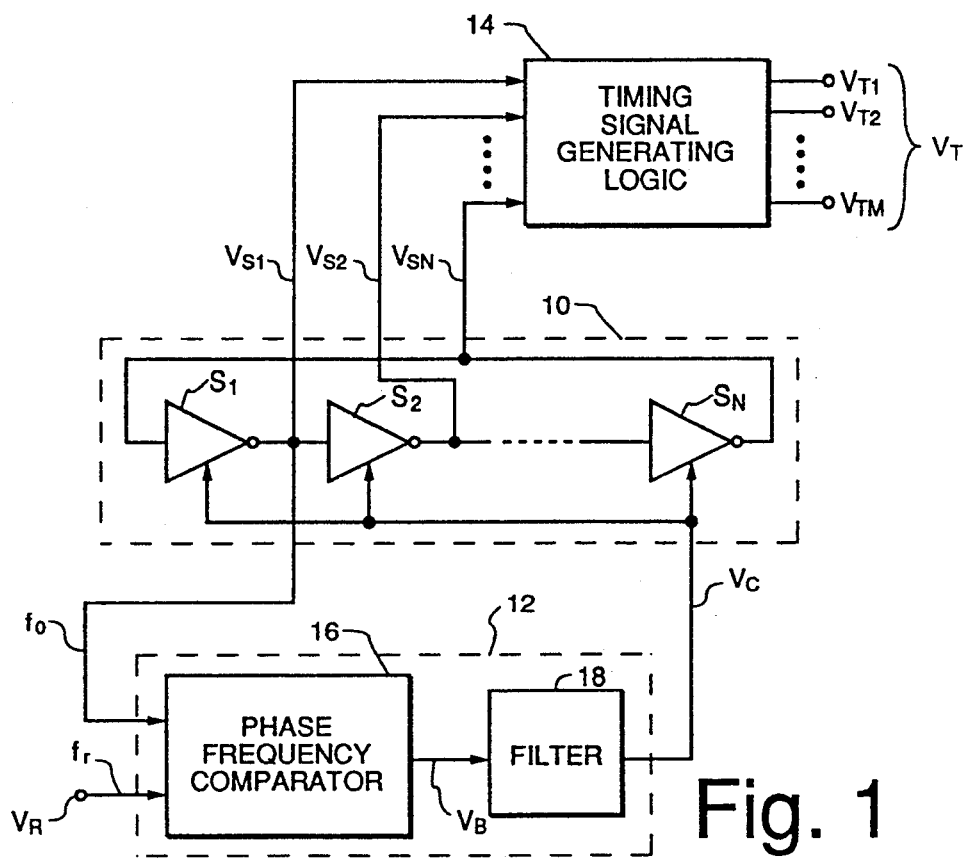
FIG. 1 is a block diagram of a timing generator in accordance with the invention.

Referring to the drawings, FIG. 1 illustrates a timing generator in accordance with the teachings of the invention. This timing generator produces M timing signals $V_{T1}$, $V_{T2}$, ... $V_{TM}$ (collectively "$V_T$") for controlling the operation of circuitry (not shown) such as dynamic random-access memories, pulse-width modulators, one-shot multivibrators, and other such digital devices that require fine timing. The timing generator consists of an oscillator section 10, a control section 12, and timing-signal generating logic 14.

Oscillator section 10 is a ring oscillator formed with an odd number N of substantially identical inverting stages $S_1$, $S_2$, ... $S_N$ arranged in a loop. Each inverting stage $S_i$, where i is an integer running from 1 to N, has a stage input (terminal) and a stage output (terminal). The stage input of each inverting stage $S_i$, except for stage $S_1$, is connected to the stage output of previous stage $S_{i-1}$. The $S_1$ stage input is connected to the $S_N$ stage output to complete the oscillator loop.

Inverting stages $S_1$ - $S_N$ respectively produce N corresponding stage signals $V_{S1}$, $V_{S2}$, ... $V_{SN}$ (collectively "$V_S$") that repeatedly switch between a low voltage level $V_{SL}$ and a high voltage level $V_{SH}$ at a basic oscillator frequency $f_O$. Each inverting stage $S_i$, except for stage $S_1$, generates its stage signal $V_{Si}$ by inverting stage signal $V_{Si-1}$ from previous stage $S_{i-1}$. Stage $S_1$ generates stage signal $V_{S1}$ by inverting stage signal $V_N$ from stage $S_N$. Each time that a stage voltage $V_{Si}$ moves from low level $V_{SL}$ to high level $V_{SH}$ or vice versa constitutes a signal transition or edge. As discussed further below, at least one of timing signals $V_T$ contains pulses whose rising and falling edges correspond to transitions of at least two different stage signals $V_S$.

Ring oscillator 10 and control section 12 are configured in a phase-locked loop that forces oscillator frequency $f_O$ to be substantially equal to a reference clock frequency $f_R$. Control 12 consists of a phase/frequency comparator 16 and a low-pass analog filter 18.

Phase/frequency comparator 16 receives two input signals: (a) a reference clock voltage signal $V_R$ at frequency $f_R$ and (b) an arbitrary one of signals $V_S$ at frequency $f_O$. Reference voltage $V_R$ is supplied from a reference oscillator (not shown). FIG. 1 illustrates the case in which the particular $V_S$ input signal supplied to comparator 16 is stage signal $V_{S1}$. Comparator 16 compares frequency $f_O$ of signal $V_{S1}$ to frequency $f_R$ of signal $V_R$ and generates a comparison voltage signal $V_B$ whose value depends on whether $f_O$ is greater than $f_R$ or less than $f_R$. Internally, comparator 16 operates by comparing the $V_{S1}$ phase to the $V_R$ phase.

Filter 18, which typically includes a grounded capacitor, filters comparison signal $V_B$ to produce a control voltage $V_C$ that is largely a DC signal. DC voltage $V_C$ is approximately proportional to frequency $f_O$ at steady-state.

Each inverting stage $S_i$ has a control input (terminal) that receives control voltage $V_C$. Stages $S_1$ - $S_N$ are configured in such a way that frequency $f_O$ varies with voltage $V_C$. When $f_O$ is less than $f_R$, voltage $V_C$ is provided at such a value as to cause $f_O$ to increase. The opposite occurs when $f_O$ is greater than $f_R$. Accordingly, the phase-locked loop causes $f_O$ to be substantially equal to $f_R$-i.e., the phase-locked loop locks onto $f_R$.

The stage-signal transmission delay through each inverting stage $S_i$ (from the $S_i$ stage input to the $S_i$ stage output) is substantially the same for all of stages $S_1$ - $S_N$ because they are substantially identical. Let $\tau$ represent the stage-signal transmission delay through each stage $S_i$. Each stage signal $V_{si}$, except for signal $V_{S1}$, thus makes a transition in one direction approximately $\tau$ after previous stage signal $V_{si-1}$ makes a transition in the other direction. Signal $V_{S1}$ makes a transition in one direction approximately $\tau$ after signal $V_{SN}$ makes a transition in the other direction. Since the number of stages $S_1$ - $S_N$ is N, each stage signal $V_{si}$ also makes a transition in one direction approximately $N\tau$ after making a transition in the other direction.

The repetition period of ring oscillator 10 is the amount of time between the instants that one of the $V_S$ signals makes consecutive transitions in the same direction. Letting $T_O$ represent the oscillator repetition period, $T_O$ equals $2N\tau$. $T_O$ also equals $1/f_O$ and therefore approximately equals $1/f_R$.

Figure 2:
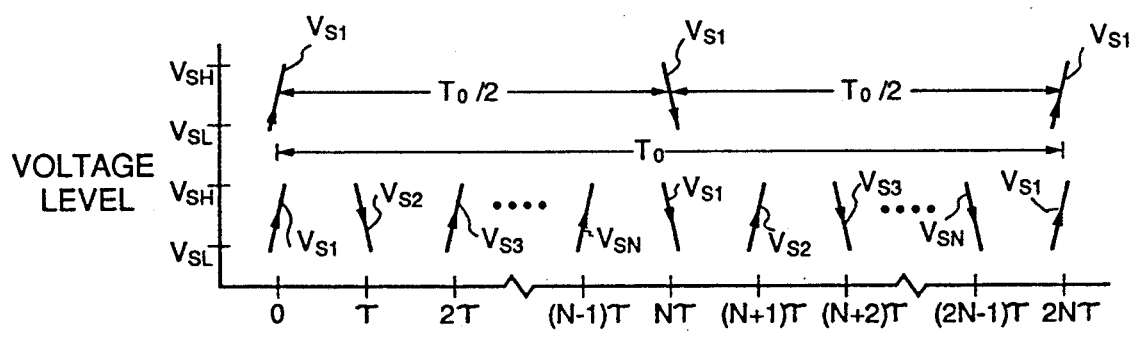
FIG. 2 is a simplified graph of stage signals as a function of time for the ring oscillator in the timing generator of FIG. 1.

Turning to FIG. 2, it depicts two sets of slanted lines that represent the voltage transitions of stage signals $V_S$. The upper set of slanted lines illustrates the transitions of signal $V_{S1}$ during a time slightly greater than $T_O$ and thus illustrates the oscillator repetition cycle. The lower set of slanted lines illustrates the transitions of all the $V_S$ signals (including the $V_{S1}$ signal) during a time slightly greater than $T_O$.

During each period $T_O$, each stage signal $V_{si}$ (including $V_{S1}$) makes a low-to-high transition and a high-to-low transition. Hence, the $V_S$ signals together make 2N equally spaced transitions during each period $T_O$. That is, as a group, the $V_S$ signals make N times as many timewise-distinct transitions as signal $V_{S1}$ by itself. Although oscillator 10 operates at frequency $f_O$, the $V_S$ signals as a group have an effective frequency $f_E$ equal to $Nf_O$ which, in turn, approximately equals $Nf_R$.

The spacing $\tau$ between the midpoints of consecutive voltage transitions of the $V_S$ signals is approximately one Nth the spacing between the midpoints of consecutive voltage transitions of reference signal $V_R$. Likewise, if only transitions in one direction are considered (e.g., only low-to-high transitions), the resultant spacing $2\tau$ between the midpoints of consecutive $V_S$ transitions in one direction is approximately one Nth the spacing between the midpoints of consecutive $V_R$ transitions in that direction. The net effect of using ring oscillator 10 and control section 12 is to generate stage signals whose edge spacing is approximately one Nth the edge spacing of voltage $V_R$ supplied by the reference oscillator.

Timing-signal generating logic 14 produces timing signals $V_T$ in response to stage signals $V_S$. The $V_T$ signals vary between a low voltage level $V_{TL}$ and a high voltage level $V_{TH}$. Each time that each timing signal $V_{Tj}$, where j is an integer running from 1 to M, moves from $V_{TL}$ to $V_{TH}$ or vice versa constitutes a signal transition or edge.

Timing-signal generating logic 14 is configured in such a way that at least one of timing signals $V_T$ has at least two transitions which correspond to transitions of at least two of stage signals $V_S$. For instance, one such timing signal $V_T$ typically contains a group of high-level pulses that repeat at a given frequency where the rising and falling edges of each pulse are respectively defined by rising (or falling) edges of two different $V_S$ signals. Typically, most (usually the vast majority) of the $V_T$ signals have at least two edges which correspond to edges of two or more of the $V_S$ signals. Since the time spacing between consecutive transitions of the $V_S$ signals as a group is approximately one Nth the time spacing between the transitions of reference voltage $V_R$, the characteristics of the $V_T$ signals can accordingly be set in time increments that are N times finer than that available from directly using voltage $V_R$.

Figure 3:
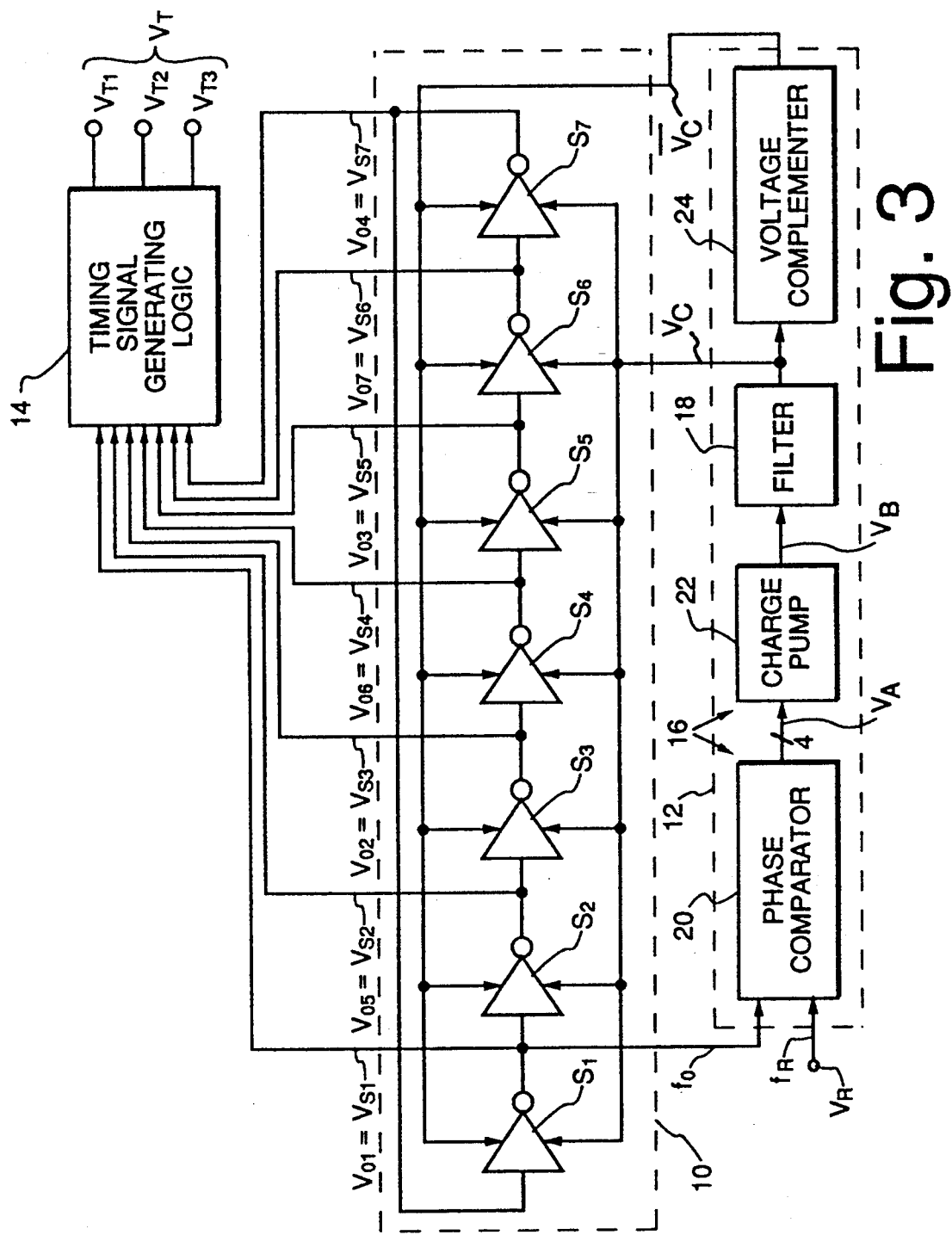
FIG. 3 is a block diagram of a preferred embodiment of the timing generator of FIG. 1.

FIG. 3 illustrates a preferred embodiment of the timing generator in FIG. 1 for which the number N of inverting stages $S_1 - S_N$ in oscillator 10 is seven. The number M of signals $V_T$ is three.

Phase/frequency comparator 16 in control section 12 of FIG. 3 consists of a phase comparator 20 and a charge pump 22. Phase comparator 20 compares the phase of stage signal $V_{S1}$ to the phase of reference signal $V_R$ and produces a plurality of adjustment signals $V_A$ indicative of the phase difference. Adjustment signals $V_A$ typically consist of (a) a signal and its complement for indicating that the $V_{S1}$ phase is ahead of the $V_R$ phase and (b) a further signal and its complement for indicating that the $V_{S1}$ phase is behind the $V_R$ phase.

Charge pump 22 generates comparison signal $V_B$ in response to adjustment signals $V_A$. If the $V_{S1}$ phase is behind the $V_R$ phase, comparator 20 provides signals $V_A$ at such values as to cause charge pump 22 to pump up the voltage of signal $V_B$. Control voltage $V_O$ thereby increases. The reverse occurs if the $V_{S1}$ phase is ahead of the $V_R$ phase.

In addition to components 18–22, control section 12 in the timing generator of FIG. 3 contains a voltage complementer 24 that receives control voltage $V_C$ provided from filter 18 in response to comparison signal $V_B$. Voltage complementer 24 generates a further control voltage signal $\overline{V}_C$ substantially complementary to control voltage $V_C$. Each inverting stage $S_i$ has a further control input (terminal) that receives voltage $\overline{V}_c$.

Figure 4:
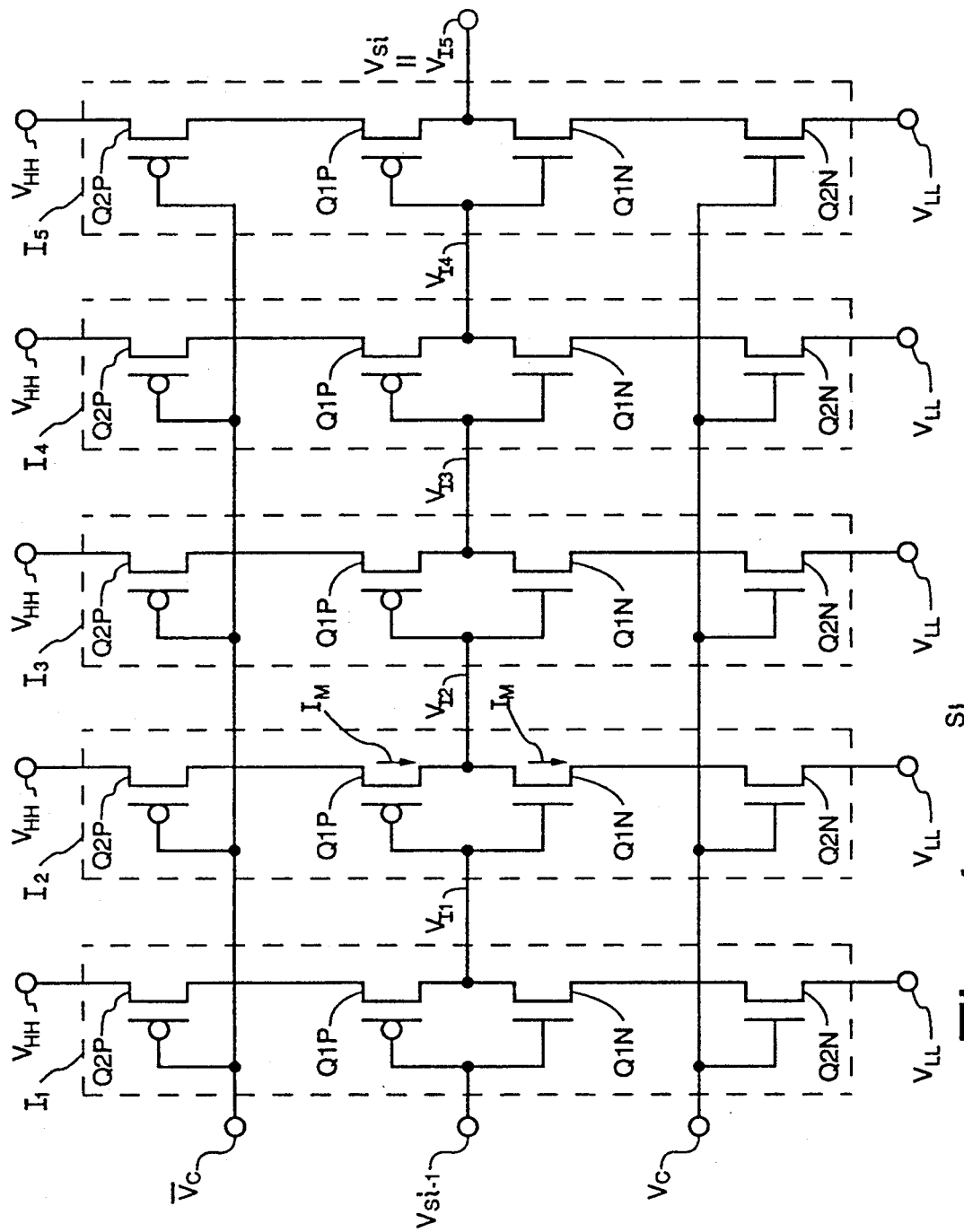
FIG. 4 is a circuit diagram of an inverting stage in the ring oscillator of the timing generator of FIG. 3.

FIG. 4 depicts the internal configuration for each inverting stage $S_i$ in the timing generator of FIG. 3. Stage $S_i$ here consists of five (an odd number) of substantially identical individual inverters $I_1, I_2, ... I_5$ arranged in series. Inverters $I_1 - I_5$ are connected between a source of a high supply voltage $V_{HH}$ and a source of a low supply voltage $V_{LL}$. Voltage difference $V_{HH} - V_{LL}$ is the power-supply voltage for all of inverting stages $S_1 - S_7$.

Each individual inverter $I_k$, where k is an integer running from 1 to 5, has a main input, a pair of control inputs, and an output. Control signals $V_C$ and $\overline{V}_C$ are supplied to the control inputs of each inverter $I_k$. Inverters $I_1 - I_5$ respectively produce five output voltage signals $V_{I1}, V_{I2}, ... V_{I5}$ at their main outputs by respectively inverting signals $V_{si-1}$ and $V_{I1} - V_{I4}$ provided at their main inputs, where signal $V_{si-1}$ is output signal of previous stage $S_{i-1}$. Output signal $V_{I5}$ is the $S_i$ stage output $V_{si}$ supplied to next stage $S_{i+1}$. Each output signal $V_{Ik}$ varies between a low voltage level $V_{SL}$ and a high voltage $V_{SH}$. The values of voltage levels $V_{SL}$ and $V_{SH}$ depend on fabrication process parameters, temperature, power-supply voltage $V_{HH} - V_{LL}$, frequency $f_O$, and the total number of inverters $I_k$ in the oscillation loop. Voltages $V_{SL}$ and $V_{SH}$ respectively tend to exponentially approach supply voltages $V_{LL}$ and $V_{HH}$.

Each individual inverter $I_k$ consists of a main N-channel field-effect transistor ("FET") Q1N, a main P-channel FET Q1P, a control N-channel FET Q2N, and a control P-channel FET Q2P. FETs Q1N, Q1P, Q2N, and Q2P are all enhancement-mode insulated-gate devices. Their channels are connected in series between the $V_{LL}$ and $V_{HH}$ supplies.

More particularly, the gate electrodes of complementary FETs Q1N and Q1P in each inverter $I_k$ are connected together to form the main $I_k$ input. The Q1N and Q1P drains are connected together to form the $I_k$ output. The drain and source of FET Q2N are respectively connected to the Q1N source and the $V_{LL}$ supply. The drain and source of FET Q2P are likewise respectively connected to the Q1P source and the $V_{HH}$ supply. The Q2N and Q2P gate electrodes form the control inputs that respectively receive control signals $V_C$ and $\overline{V}_C$.

Complementary FETs Q1N and Q1P in each individual inverter $I_k$ of each stage $S_i$ in FIG. 4 basically constitute a CMOS inverter. The interconnected channels of FETs Q1N and Q1P form a main current path through which a main inverter current $I_M$ flows. Main current $I_M$ is specifically illustrated in inverter 12 of FIG. 4.

The value of main current $I_M$ in each individual inverter $I_k$ depends on the conductive levels of its control FETs Q2N and Q2P. Increasing the conductive levels of FETS Q2N and Q2P by raising control voltage $V_C$ and simultaneously reducing control voltage $\overline{V}_C$ enables current $I_M$ to reach a greater magnitude. This increases the rate at which output voltage $V_{Ik}$ changes during a rising or falling transition between levels $V_{SL}$ and $V_{SH}$ and, as a result, decreases the $V_{Ik}$ rise and fall times. Similarly, decreasing the conductive levels of FETs Q2N and Q2P by reducing voltage $V_C$ and simultaneously raising voltage $\overline{V}_C$ reduces the magnitude that current $I_M$ can reach. The rate at which output voltage $V_{Ik}$ changes during rising and falling transitions decreases so as to increase the $V_{Ik}$ rise and fall times.

With the foregoing in mind, the phase-locked loop in the timing generator of FIG. 3 controls oscillator frequency $f_O$ in the following way. If $f_O$ is less than $f_R$ as determined by phase comparator 20, control section 12 increases control voltage $V_C$ and simultaneously decreases control voltage $\overline{V}_C$. The rise and fall times of voltages $V_{I1} - V_{I5}$ in each inverting stage $S_i$ thereby decrease. This causes $f_O$ to increase towards $f_R$. The opposite occurs if $f_O$ is greater than $f_R$. The result is that $f_O$ becomes substantially equal to $f_R$.

The oscillator power-supply voltage $V_{HH} - V_{LL}$ preferably is 5 volts. As a result, oscillator frequency $f_O$ can be varied from approximately 15 MHz to approximately 35 MHz. In the preferred embodiment, reference frequency $f_R$ is approximately 28 MHz and thus falls within the $f_O$ variation range. Since effective frequency $f_E$ is approximately $Nf_R$, $f_E$ is in the vicinity of 200 MHz, a value that would be difficult to attain with a conventional crystal oscillator without incurring significant power-dissipation problems.

Each inverting stage $S_i$ in FIG. 4 could be formed with an odd number of serially connected inverters different from five. Consider the general case in which each stage $S_i$ consists of an odd number P of individual inverters connected in series in the manner shown in FIG. 4. The total number of inverters in the oscillator loop is then NP.

The average rise time $t_{RAVG}$ of the individual inverters normally differs from the average fall time $t_{FAVG}$ of the inverters. This introduces a timing error into the timing generator. The timing error approximately equals $(t_{FAVG} - t_{RAVG})/NP$, where $t_{RAVG}$ and $t_{FAVG}$ are measured from the 10% to 90% voltage switching points. In comparison to the case where each inverting stage $S_i$ consists of a single individual inverter, the use of P individual inverters in each stage $S_i$ thereby reduces the rise/fall timing error by a factor of N. In the preferred embodiment, the rise/fall timing error is 1/5 of that which would arise if each stage $S_i$ were formed with one inverter.

Figure 5:
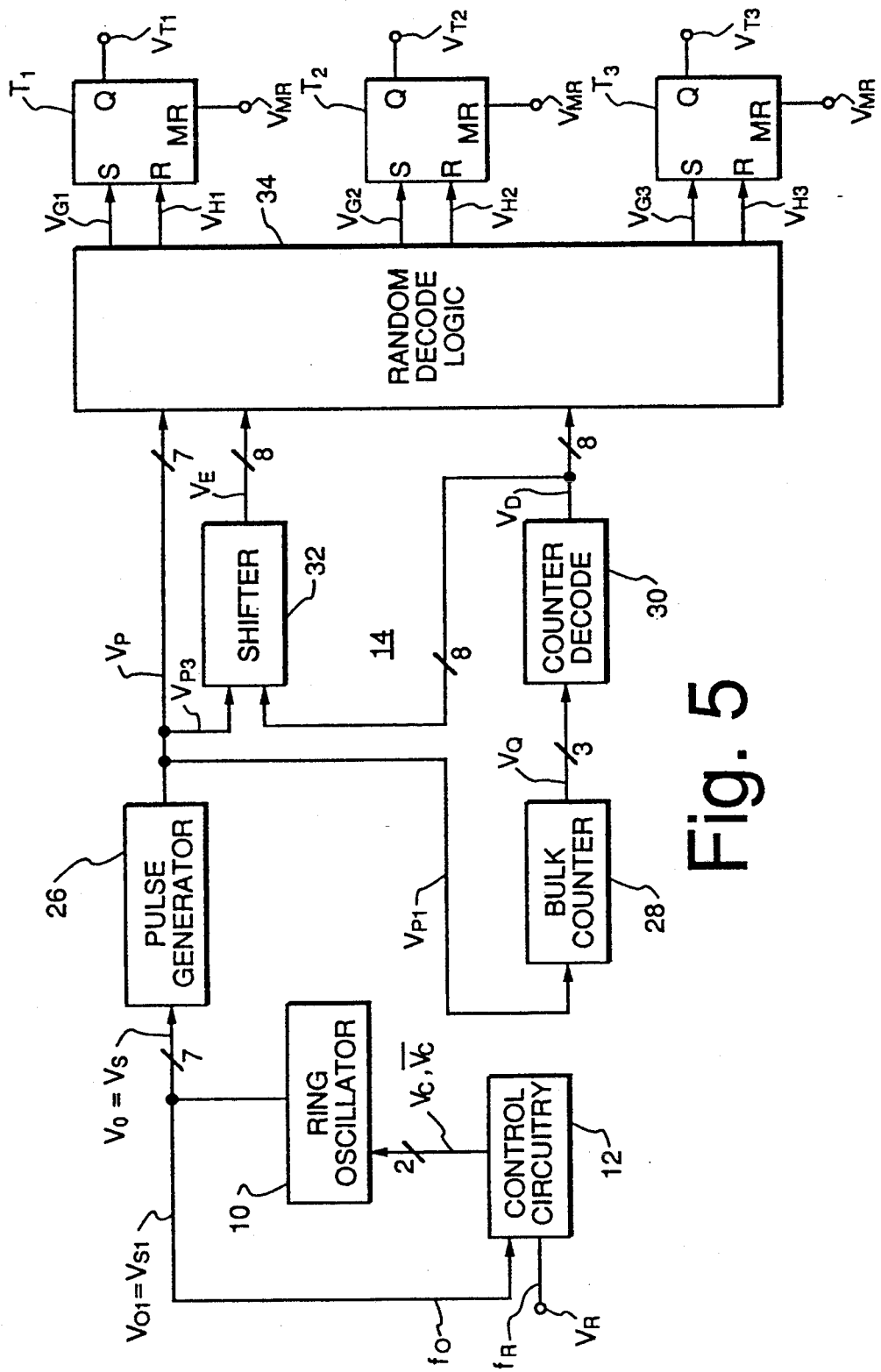
FIG. 5 is a block diagram of the timing generator of FIG. 3 with the components of the timing-signal generating logic broken out in special detail.

FIG. 5 illustrates the internal construction of timing-signal generating logic 14 in FIG. 3. Logic 14 here consists of a pulse generator 26, a bulk counter 28, a counter decode 30, an edge shifter 32, random decode logic 34, and three output timing latches $T_1$, $T_2$, and $T_3$. As noted above, M is three in the preferred embodiment.

Pulse generator 26 is formed with logic gates that convert stage signals $V_S$ into seven pulse voltage signals $V_{P1}$, $V_{P2}$, ... $V_{P7}$ (collectively "$V_P$"). Pulse signals $V_P$ vary between a low voltage level, typically about 0.2 volt above $V_{LL}$, and a high voltage level, typically about 0.2 volt below $V_{HH}$. Pulse signals $V_P$ are at their high voltage levels for considerably shorter times than stage signals $V_S$.

Figure 6:
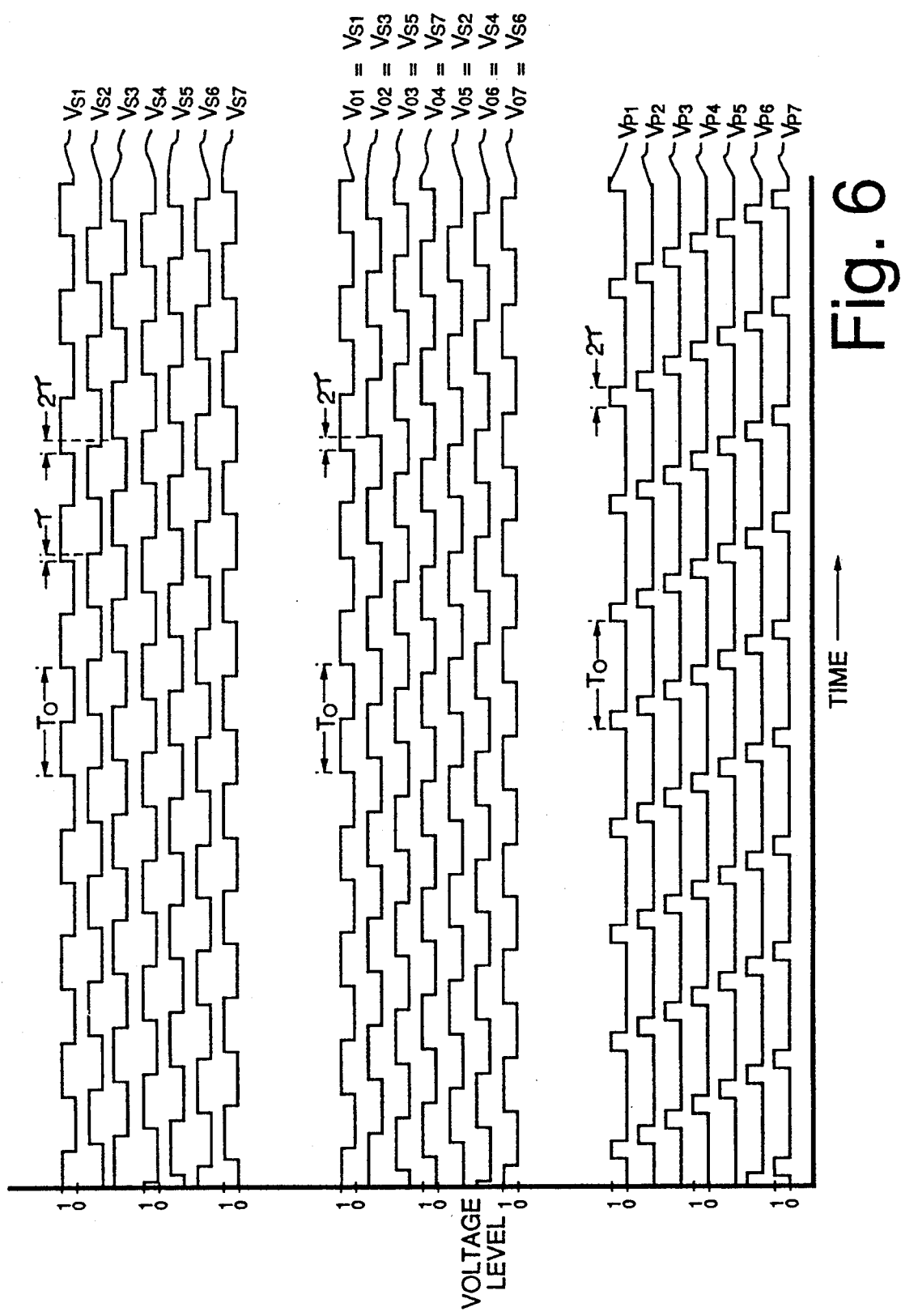
FIG. 6 is a simplified graph of stage and pulse signals as a function of time for the timing generator of FIGS. 3 and 5.

The signal conversion performed by pulse generator 26 can be understood with the assistance of the simplified voltage curves shown in FIG. 6. The upper seven curves in FIG. 6 illustrate the $V_S$ signals starting with $V_{S1}$ at the top and ending with $V_{S7}$ at the bottom. The middle seven curves present a rearranged version of the $V_S$ signals in which they are ordered so that transitions in the same direction progressively occur at later times in going from the top curve to the bottom curve. Signals $V_{S1}$, $V_{S3}$, $V_{S5}$, $V_{S7}$, $V_{S2}$, $V_{S4}$, and $V_{S6}$ have been respectively relabeled as signals $V_{01}$, $V_{02}$, ... $V_{07}$ (collectively "$V_O$") in FIG. 6.

The bottom seven curves in FIG. 6 illustrate pulse signals $V_P$. Using the relabeled version of the $V_S$ signals, each pulse signal $V_{Pi}$, except for signal $V_{P7}$, the logical AND of signals $\overline{V}_{oi}$ and $V_{oi+1}$, where $\overline{V}_{oi}$ is the inverse (or complement) of $V_{oi}$. Signal $V_{P7}$ is the logical AND of signals $\overline{V}_{o7}$ and $V_{o1}$. As shown in FIG. 6, each pulse signal $V_{Pi}$ consists of a train of high-level pulses having a pulse width of $2\tau$ and a period of $T_O$.

Figure 7:
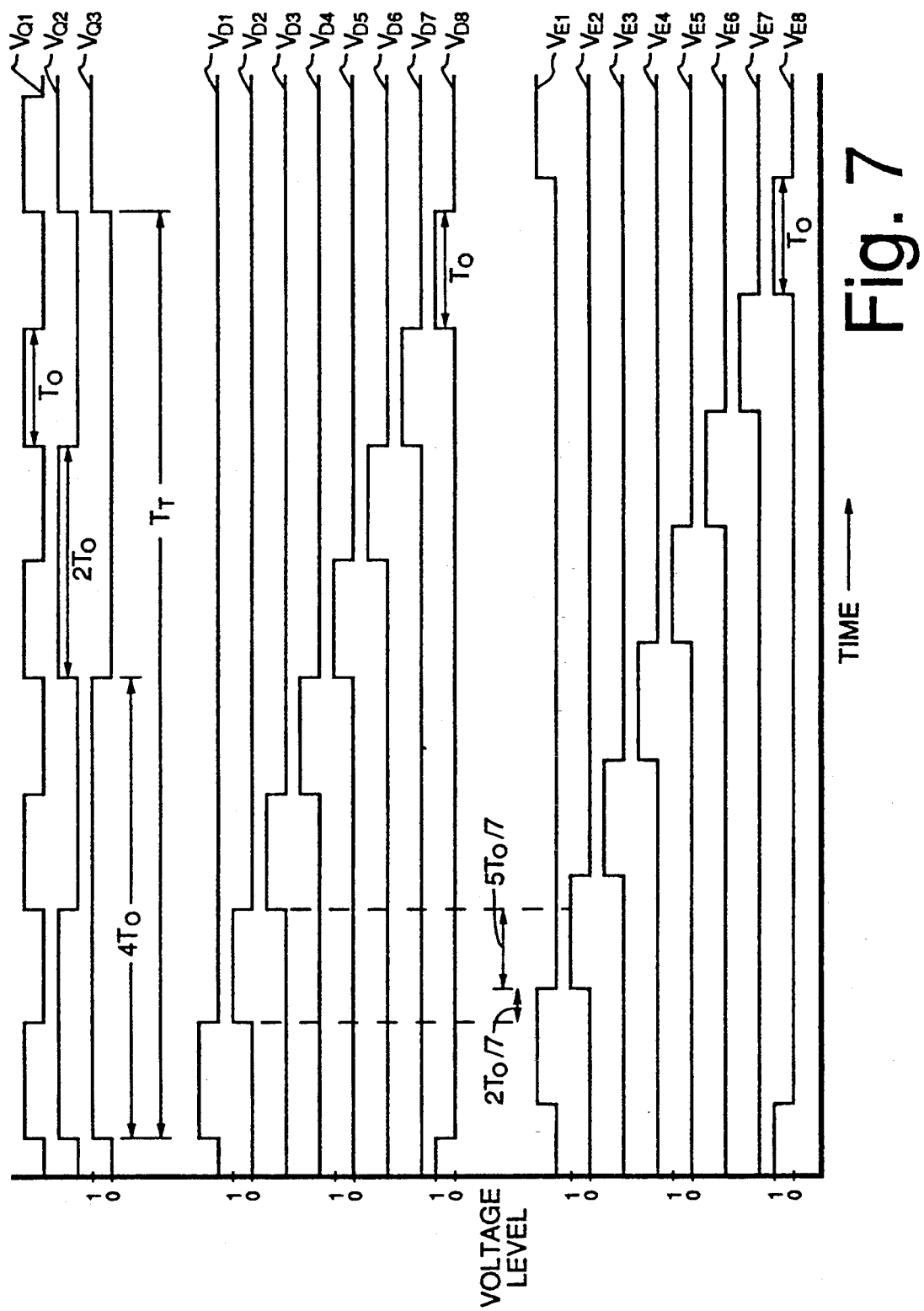
FIG. 7 is a simplified graph of counting and sequencing signals as a function of time for the timing generator of FIGS. 3 and 5.

The timing generator of FIGS. 3 and 5 is characterized by an overall repetition period $T_T$ greater than oscillator period $T_O$. Bulk counter 28, counter decode 30, and edge shifter 32 form a sequencing circuit that generates a group of sequencing signals which (a) subdivide overall period $T_T$ into overlapping time segments and (b) repeat every new $T_T$ period. FIG. 7, discussed further below, illustrates simplified voltage curves for components 28-32 in the preferred embodiment for a time slightly greater than one $T_T$.

Bulk counter 28 counts the (high-level) pulses of one of pulse signals $V_P$ and produces a group of counting signals $V_Q$ indicative of the count. When a selected maximum count K is reached, counter 28 resets to zero and starts counting again. This occurs automatically—i.e., without the need to use special reset logic for generating a reset signal—when, as in the preferred case, counter 28 is a power-of-2 counter, and selected maximum count K equals that power of 2. Overall period $T_T$ is the maximum count period—i.e., the time that counter 28 takes to reach maximum count K.

The timing generator of FIGS. 3 and 5 typically provides timing signals $V_T$ to circuitry that is switched among a group of different timing modes. For example, the circuitry controlled by the timing generator could be a dynamic random-access memory selectively operable in a one-write/four-read mode, in a one-write/one-read mode, in a refresh mode, and possibly in one or more other such modes. The duration of overall (or maximum count) period $T_T$ is preferably chosen to be sufficiently long that each of the timing modes can be started and completed during period $T_T$. Thus, each of the timing modes can be utilized without having to take any special action to adjust the $T_T$ duration.

Counter decode 30 consists of logic gates which decode counting signals $V_Q$ to produce a first set of sequencing signals $V_D$ that establish time segments (or subdivisions) of overall period $T_T$. The number of sequencing signals $V_D$ equals K (the maximum count). The $V_D$ signals vary between two voltage levels, typically close to $V_{LL}$ and $V_{HH}$. Each sequencing signal $V_D$ is high for a time equal to $T_O$ during a different count of counter 28 and is low at other times. When one sequencing signal $V_D$ goes high, another goes low such that only one signal $V_D$ is high at a time. Consequently, the $V_D$ signals go in sequence from their low level to their high level and return to the low level in the same sequence. The high portions of the $V_D$ signals cover the entire period $T_T$.

During each oscillator period $T_O$, each pulse signal $V_{Pi}$ makes precisely one low-to-high transition and one high-to-low transition. Since the high portions of sequencing signals $V_D$ cover overall period $T_T$ and each sequencing signal $V_D$ is high for a time equal to oscillator period $T_O$, any $V_S$ transition during overall period $T_T$, except for $V_S$ transitions that correspond (identically) to $V_D$ transitions, can be uniquely identified by a selected one of the $V_D$ signals and a selected one of the $V_P$ signals.

In order to be able to uniquely identify each $V_S$ transition that corresponds to a $V_D$ transition, a second group of K sequencing signals $V_E$ are supplied from edge shifter 32. Sequencing signals $V_E$ have the same characteristics as the $V_D$ signals except that the transitions in the $V_E$ signals are respectively delayed from the transitions in the $V_D$ signals by an amount that typically lies between zero and oscillator period $T_O$ and, in any case, is not an integer multiple of $T_O$. Consequently, the time segment during which each sequencing signal $V_D$ is at its high level is overlapped by two of sequencing signals $V_E$, one during part of the high $V_D$ segment and the other during the remainder of the high $V_D$ segment.

As a composite group, the $V_D$ and $V_E$ signals go in sequence from a low voltage level to a high voltage level and back to the low level in the same sequence. Any $V_S$ transitions during overall period $T_T$ are uniquely selected by choosing an appropriate one of the $V_P$ signals and an appropriate one of either the $V_D$ signals or the $V_E$ signals. One of the $V_E$ signals is used if the desired $V_S$ transition corresponds to a $V_D$ transition, and vice versa.

Edge shifter 32 typically consists of a group of D-type flip-flops (not shown) whose clock inputs all receive one $V_P$ signal other than the $V_P$ signal supplied to counter 28. The data input of each flip-flop receives a different one of the $V_D$ signals. When the $V_P$ signal supplied to the clock input goes high, the already-high values of the $V_D$ signals are clocked into the flip-flops to produce the $V_E$ signals.

Maximum count K is 8 in the preferred embodiment. Accordingly, three $V_Q$ signals $V_{Q1}$, $V_{Q2}$, and $V_{Q3}$ are sufficient to indicate when K is reached. There are eight $V_D$ signals $V_{D1}$, $V_{D2}$ ... $V_{D8}$ and another eight $V_E$ signals $V_{E1}$, $V_{E2}$, ... $V_{E8}$ for a total of sixteen sequencing signals. Counter 28 counts the pulses of signal $V_{P1}$, while pulse signal $V_{P3}$ is supplied to the clock inputs of the (resulting) eight D-type flip-flops in shifter 32. Consequently, the delay between the $V_D$ and $V_E$ signals is approximately $2T_O/7$ or $4\tau$.

FIG. 7 illustrates simplified versions of the $V_Q$, $V_D$, and $V_E$ signals in the preferred embodiment. The upper three curves in FIG. 7 represent the $V_Q$ signals. $V_{Q1}$ is the least significant bit. $V_{Q3}$ is the most significant bit. The next eight curves are the $V_D$ signals, each of which is high for a different time segment equal to $T_O$. The last eight curves are the $V_E$ signals, each of which is similarly high for a different time segment equal to $T_O$.

Random decode logic 34 combines certain of the $V_P$ signals with certain of the $V_D$ and $V_E$ signals to produce three rising-edge selection signals $V_{G1}$, $V_{G2}$, and $V_{G3}$ (collectively "$V_G$") and three falling-edge selection signals $V_{H1}$, $V_{H2}$, and $V_{H3}$ (collectively "$V_H$"). Selection signals $V_G$ and $V_H$ vary between two voltage levels, again typically close to $V_{LL}$ and $V_{HH}$. Each selection signal $V_{Gj}$ has a rising transition corresponding to a desired rising edge of timing signal $V_{Tj}$. Each selection signal $V_{Hj}$ has a rising transition corresponding to a desired falling edge of signal $V_{Tj}$.

Each output timing latch $T_j$ has a set input that receives selection signal $V_{Gj}$, a reset input that receives selection signal $V_{Hj}$, and an output that provides timing signal $V_{Tj}$. The $V_T$ signals vary between two voltage levels, again typically close to $V_{LL}$ and $V_{HH}$. When selection signal $V_{Gj}$ makes a low-to-high transition, latch $T_j$ sets timing signal $V_{Tj}$ at the high voltage level. When selection signal $V_{Hj}$ later makes a low-to-high transition, latch $T_j$ resets signal $V_{Tj}$ to the low level. Latches $T_1$ - $T_3$ also have master reset inputs for receiving a master reset signal $V_{MR}$ to simultaneously reset all the $V_T$ signals to the low level.

Figure 8A:
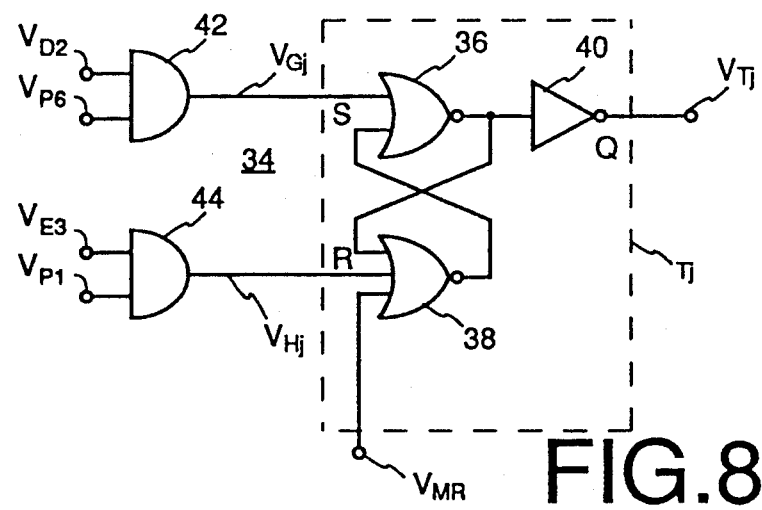
FIGS. 8a and 8b are circuit diagrams of exemplary portions of the random decode logic and output timing latches in the timing generator of FIGS. 3 and 5.
Figure 8B:
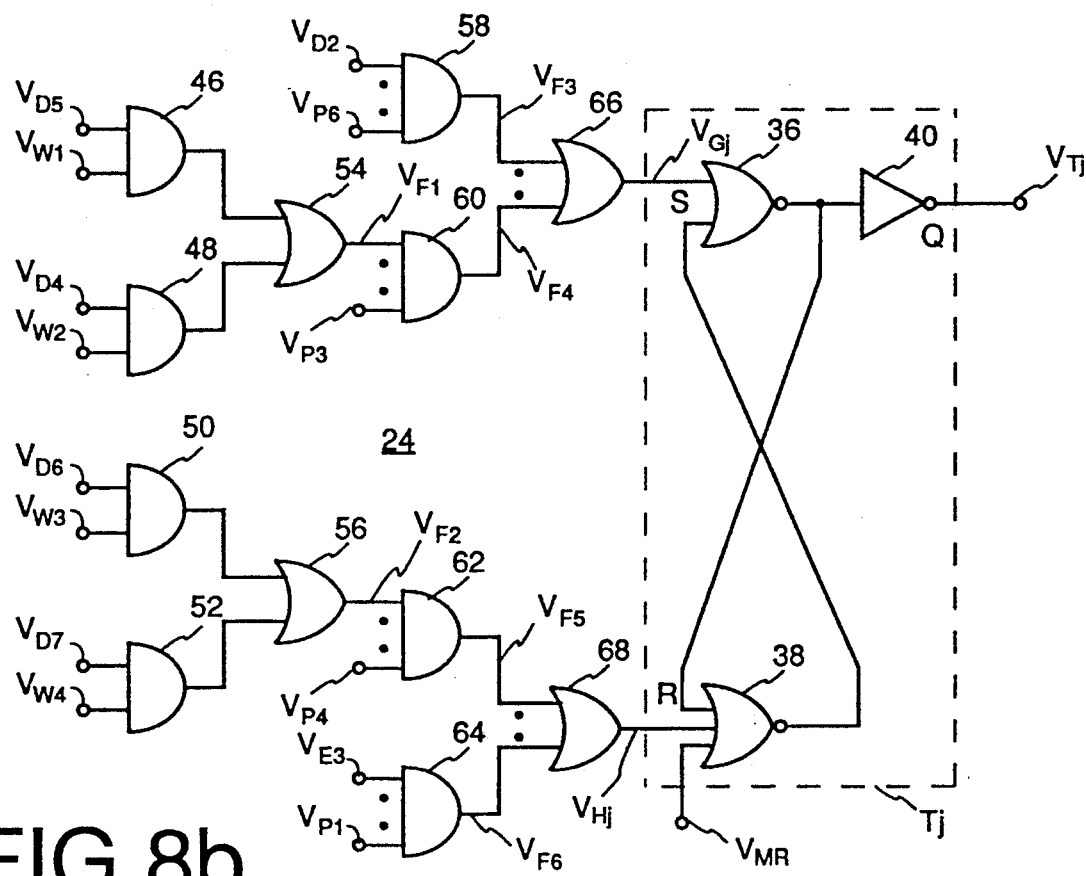

FIGS. 8a and 8b illustrate examples of how portions of decode logic 34 are internally configured for providing selection signals $V_{Gj}$ and $V_{Hj}$ to typical output timing latch $T_j$. FIGS. 9a and 9b present simplified voltage curves illustrating how timing signal $V_{Tj}$ is produced in these two examples starting from the $V_P$, $V_D$, and $V_E$ signals. In order to make it easier to graphically see the relationship among the various signals, the signal transition delays through the various gates that form latch $T_j$ and the portions of logic 34 in FIGS. 8a and 8b are not incorporated into the voltage curves of FIGS. 9a and 9b. When the gate delays are taken into consideration, the results are qualitatively the same as discussed below even though certain of the transitions occur at later times (further to the right) than shown in FIGS. 9a and 9b.

In the examples shown in both of FIGS. 8a and 8b, latch $T_j$ contains a pair of cross-connected NOR gates 36 and 38 to which signals $V_{Gj}$ and $V_{Hj}$ are supplied. Master reset signal $V_{MR}$ is also provided to gate 38. Gate 36 furnishes its output signal to an inverter 40 whose inverted output signal is timing signal $V_{Tj}$.

In the example of FIG. 8a, each of selection signals $V_{Gj}$ and $V_{Hj}$ is generated simply by logically ANDing one of the $V_P$ signals and one of the $V_D$ or $V_E$ signals. Specifically, decode logic 34 contains AND gates 42 and 44. Gate 42 ANDs signals $V_{D2}$ and $V_{P6}$ to produce signal $V_{Gj}$. Gate 44 ANDs signals $V_{E3}$ and $V_{P1}$ to produce signal FIG. 9a depicts signals $V_{D2}$, $V_{P6}$, $V_{Gj}$, $V_{E3}$, $V_{P1}$, and $V_{Hj}$ for the example of FIG. 8a. Because signals $V_{Gj}$ and $V_{Hj}$ are produced from the $V_P$, $V_D$, and $V_E$ signals simply by performing AND operations in this example, timing signal $V_{Tj}$ has a single high-level pulse during each overall period $T_T$ as shown in FIG. 9a. This pulse occurs at a fixed location in period $T_T$.

The example of FIG. 8b illustrates a more complex case in which timing signal $V_{Tj}$ has multiple high-level pulses during each overall period $T_T$ and in which the locations of these pulses within period $T_T$ can be controllably varied from one $T_T$ period to the next $T_T$ period so as to allow a group of timing modes to be implemented. In this example, decode logic 34 contains AND gates 46, 48, 50, and 52, OR gates 54 and 56, AND gates 58, 60, 62, and 64, and OR gates 66 and 68.

Mode-select signals $V_{W1}$, $V_{W2}$, $V_{W3}$, and $V_{W4}$ are respectively supplied to gates 46–52. Each of gates 46–52 also receives one of the $V_D$ and $V_E$ signals. If any of mode-select signals $V_{W1}$ - $V_{W4}$ is high at the same time that the associated one of the $V_D$ and $V_E$ signals is high, the corresponding one of gates 46–52 provides its output signal at a high value. Gate 54 provides its output signal $V_{F1}$ at a high value whenever the output signal from gate 46 or 48 is high. Gate 56 similarly provides its output signal $V_{F2}$ at a high value whenever the output signal from gate 50 or 52 is high.

Gate 58 ANDs signals $V_{D2}$, $V_{P6}$, and possibly one or more other signals (not shown) to produce a signal $V_{F3}$. Gate 60 similarly AND signals $V_{F1}$, $V_{P3}$, and possibly one or more other signals (also not shown) to produce a signal $V_{F4}$. Gate 66 provides selection signal $V_{Gj}$ at a high value whenever signal $V_{F3}$, signal $V_{F4}$, or any of the one or more other (unshown) input signals to gate 66 is high. Each of these inputs to gate 66 defines a rising edge for a different high-level pulse in timing signal $V_{Tj}$ provided that gate 68 defines suitable falling edges for the $V_{Tj}$ pulses.

Gate 62 ANDs signals $V_{F2}$, $V_{P4}$, and possibly one or more other signals (not shown) to produce a signal $V_{F5}$. Gate 64 ANDs signals $V_{E3}$, $V_{P1}$, and possibly one or more other signals (also not shown) to produce a signal $V_{F6}$. Gate 68 furnishes selection signal $V_{Hj}$ at a high value whenever signal $V_{F5}$, signal $V_{F6}$, or any of the one or more other (unshown) input signals to gate 68 is high. Each of these input signals to gate 68 defines a falling edge for a different high-level $V_{Tj}$ pulse provided that gate 66 defines suitable rising edges for the $V_{Tj}$ pulses.

FIG. 9b depicts signals $V_{F1}$ - $V_{F6}$, $V_{P3}$, $V_{P4}$, $V_{Gj}$, and $V_{Hj}$ for the example of FIG. 8b. Signal $V_{F1}$ is shown for the case in which mode-select signal $V_{W1}$ is high during the $V_{D5}$ high-level pulse while mode-select signal $V_{W2}$ is low during the $V_{D4}$ high-level pulse. Signal $V_{F2}$ is shown for the case in which mode-select signal $V_{W4}$ is high during the $V_{D7}$ high-level pulse while mode-select signal $V_{W3}$ is low during the $V_{D6}$ high-level pulse. In addition, FIG. 9b illustrates timing signal $V_{Tj}$ for the situation in which only the preceding signals produce $V_{Tj}$ pulses. As shown in FIG. 9b, these signals cause timing signal $V_{Tj}$ to have two pulses during each overall period $T_T$. The positions of the falling edge of the first $V_{Tj}$ pulse and the rising edge of the second $V_{Tj}$ pulse during each $T_T$ period are controlled by mode-select signals $V_{W1}$ - $V_{W4}$.

Figure 10A:
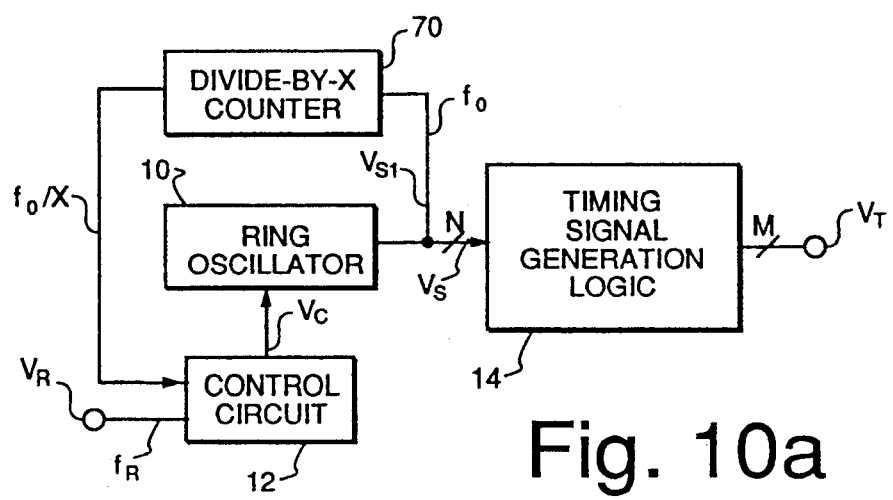
FIGS. 10a and 10b are block diagrams of alternative timing generators in accordance with the invention.
Figure 10B:
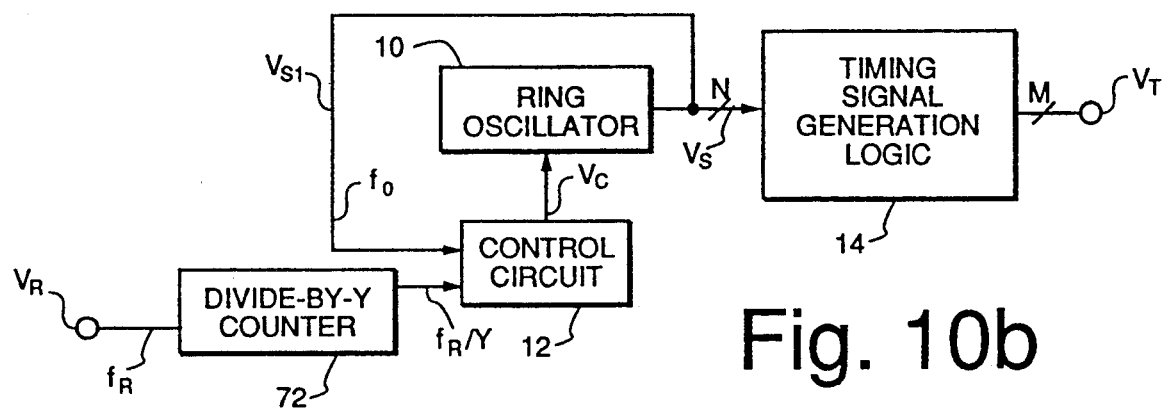

The timing generator of FIG. 1 could be modified so that the phase-locked loop locks onto an integer multiple or a fraction of reference frequency $f_R$. Specifically, a divide-by-X counter 70, where X is an integer, could be inserted between the $V_{S1}$ line and control section 12 as shown in FIG. 10a. Oscillator frequency $f_O$ then becomes substantially equal to $Xf_R$. Similarly, a divide-by-Y counter 72, where Y is also an integer, could be inserted between the $V_R$ line and control 12 as depicted in FIG. 10b. As a result, frequency $f_O$ becomes substantially equal to $f_R/Y$.

Counters 70 and 72 could both be used in the present timing generator. In this case, frequency $f_O$ becomes substantially equal to $Xf_R/Y$. The phase-locked loop locks onto a fractional integer multiple of reference frequency $f_R$.

While the invention has been described with reference to particular embodiments, this description is solely for the purpose of illustration and is not to be construed as limiting the scope of the invention claimed below. Oscillator section 10 could be implemented with a non-inverting multi-stage oscillating delay chain instead of a ring oscillator. In this case, suitable initiation logic would be employed to cause the delay chain to oscillate. Also, oscillation section 10 could be implemented as a combination of inverting and non-inverting stages. The signal-transmission delays could differ from stage to stage dependent upon design objectives.

Pulse generator 26 could be deleted. Components 28–32 could be replaced with a timing chain consisting of a number of identical timing stages arranged in a loop for producing sequencing signals analogous to the $V_D$ and $V_E$ signals. The signal polarities could be reversed so that the $V_T$ timing signals consist of low-level pulses rather than high-level pulses.

The inverter or inverters (e.g., $I_1$ - $I_5$) that form each inverting stage $S_i$ could be implemented partially or totally with bipolar transistors. In fact, the inverters in stages $S_1$ - $S_N$ could be created according to, or in combination with, technologies beside semiconductor technology. Various modifications and applications may thus be made by those skilled in the art without departing from the true scope and spirit of the invention as defined in the appended claims.

We claim:

1. An electronic circuit comprising:
   oscillator means comprising a plural number of corresponding stages for respectively producing a like number of corresponding stage signals that sequentially move between voltage levels at a basic oscillator frequency; and
   generating means responsive to at least two of the stage signals for generating at least one timing signal that has at least two transitions which correspond to transitions of at least two of the stage signals, said generating means including
   selection means responsive to at least two of the stage signals for providing selection signals having single direction transitions which correspond to both rising and falling transitions of the at least one timing signal; and
   conversion means for converting the selection signals into the at least one timing signal.

2. A circuit as in claim 1 further including control means for causing the oscillator frequency to have a substantially fixed relationship to a reference frequency.

3. A circuit as in claim 2 wherein the control means is arranged in a phase-locked loop.

4. A circuit as in claim 1 wherein the selection means comprises:
   sequencing means for producing sequencing signals which vary substantially between a first voltage level and a second voltage level and which respectively go, unless interrupted, in sequence from the first level to the second level and from the second level back to the first level; and
   logic means for producing the selection signals by combining at least one of the sequencing signals with at least two of the stage signals or with signals having transitions corresponding to transitions of at least two of the stage signals.

5. A circuit as in claim 4 wherein the sequencing means produces the sequencing signals in response to at least one of the stage signals or in response to at least one signal having transitions corresponding to transitions of at least one of the stage signals.

6. A circuit as in claim 4 wherein:
   said at least one timing signal is available for supply to further circuitry selectively operable in any of a plurality of timing modes; and
   the sequencing signals, unless interrupted, repeat at an overall repetition period sufficiently long for each of the timing modes to start and finish.

7. A circuit as in claim 1 wherein the conversion means provides said at least one timing signal (a) at a high voltage level in response to one of the single-direction transitions of one of the selection signals and (b) at a low voltage level in response to one of the single-direction transitions of another one of the selection signals.

8. An electronic circuit comprising:
   a ring oscillator that comprises an odd plural number of inverting stages arranged in a loop for respectively producing a like number of corresponding stage signals which sequentially move between signal levels at a basic oscillator frequency; and
   a generating section responsive to at least two of the stage signals for generating at least one timing signal that has at least two transitions which correspond to transitions of at least two of the stage signals, said generating section including
   selection means responsive to at least two of the stage signals for providing selection signals having single-direction transitions which correspond to both rising and falling transitions of said at least one timing signal; and
   conversion means for converting the selection signals into said timing signal.

9. A circuit as in claim 8 further including a control section for causing the oscillator frequency to have a substantially fixed relationship to a reference frequency.

10. A circuit as in claim 9 wherein the control section is arranged in a phase-locked loop.

11. A circuit as in claim 10 wherein the phase-locked loop locks the oscillator frequency onto the reference frequency.

12. A circuit as in claim 10 wherein the phase-locked loop locks the oscillator frequency onto an integer multiple of the reference frequency.

13. A circuit as in claim 10 wherein the phase-locked loop locks the oscillator frequency onto a fraction of the reference frequency.

14. A circuit as in claim 10 wherein the control section comprises a phase/frequency comparator and a filter.

15. A circuit as in claim 8 wherein:
    each inverting stage comprises at least two circuit elements coupled in series such that a main current flows along a main current path through the circuit elements; and
    a control section provides at least one control signal for controlling the main current in each inverting stage.

16. A circuit as in claim 15 wherein the circuit elements in each inverting stage comprise a pair of complementary field-effect transistors, each having a source and a drain between which a channel extends, the drains coupled together such that the main current path comprises the channels.

17. A circuit as in claim 8 wherein the inverting stages are substantially identical.

18. A circuit as in claim 8 wherein each inverting stage comprises a further odd plural number of inverters coupled in series.

19. A circuit as in claim 18 wherein the further odd number for each inverting stage is the same as the further odd number for each other inverting stage.

20. A circuit as in claim 18 wherein:
    each inverter comprises at least two circuit elements coupled in series such that a main current flows along a main current path through the circuit elements; and
    a control means provides at least one control signal for controlling the main current in each inverter.

21. A circuit as in claim 20 wherein the circuit elements in each inverter comprise a pair of complementary field-effect transistors, each having a source and a drain between which a channel extends, the drains coupled together such that the main current path comprises the channels.

22. A circuit as in claim 8 wherein the selection means comprises:
    sequencing means for producing sequencing signals which vary substantially between a first voltage level and a second voltage level and which respectively go, unless interrupted, in sequence from the first level to the second level and from the second level back to the first level; and
    logic means for producing the selection signals by combining at least one of the sequencing signals with at least two of the stage signals or with signals having transitions corresponding to transitions of at least two of the stage signals.

23. A circuit as in claim 22 wherein the sequencing means produces the sequencing signals in response to at least one of the stage signals or in response to at least one signal having transitions corresponding to transitions of at least one of the stage signals.

24. A circuit as in claim 22 wherein the sequencing means includes a counter.

25. A circuit as in claim 22 wherein:
    each said timing signal is available for supply to further circuitry selectively operable in any of a plurality of timing modes; and
    the sequencing signals, unless interrupted, repeat at an overall repetition period sufficiently long for each of the timing modes to start and finish.

26. A circuit as in claim 8 wherein the conversion means provides said at least one timing signal (a) at a high voltage level in response to one of the single-direction transitions of one of the selection signals and (b) at a low voltage level in response to one of the single-direction transitions of another one of the selection signals.

* * * * *